United States Patent
Renger et al.

(10) Patent No.: US 7,603,399 B2
(45) Date of Patent: Oct. 13, 2009

(54) METHOD AND DEVICE FOR FORMING NOISE-FILTERED OUTPUT VALUES FROM INPUT VALUES ENCUMBERED WITH NOISE

(75) Inventors: Walter Renger, Altenmarkt (DE); Christian Rutkowski, Traunstein (DE)

(73) Assignee: Dr. Johannes Heidenhain GmbH, Traunreut (DE)

( * ) Notice: Subject to any disclaimer, the term of this patent is extended or adjusted under 35 U.S.C. 154(b) by 872 days.

(21) Appl. No.: 11/189,676

(22) Filed: Jul. 25, 2005

(65) Prior Publication Data
US 2006/0020651 A1    Jan. 26, 2006

(30) Foreign Application Priority Data
Jul. 24, 2004    (DE) .................. 10 2004 036 069

(51) Int. Cl.
*G06F 17/10* (2006.01)

(52) U.S. Cl. ...................... 708/300
(58) Field of Classification Search ......... None
See application file for complete search history.

(56) References Cited

U.S. PATENT DOCUMENTS 5,188,117 A * 2/1993 Steinhaus et al. .......... 600/521
5,255,202 A * 10/1993 Kido et al. .................. 702/190
5,701,261 A * 12/1997 Evans ......................... 708/300

FOREIGN PATENT DOCUMENTS
JP    5-68389    3/1993

* cited by examiner

*Primary Examiner*—David H Malzahn
(74) *Attorney, Agent, or Firm*—Kenyon & Kenyon LLP

(57) ABSTRACT

A method for noise filtering and a noise filter are for the filtering of override signals in a numerical control system. If an input value change condition is present, an accumulator is reset and an input value is set as the new output value of noise filter. If a noise detection condition is present, the accumulator is reset while the output value is maintained.

13 Claims, 3 Drawing Sheets

METHOD AND DEVICE FOR FORMING NOISE-FILTERED OUTPUT VALUES FROM INPUT VALUES ENCUMBERED WITH NOISE

CROSS-REFERENCE TO RELATED APPLICATIONS

The present application claims priority to Application No. 10 2004 036 069.3, filed in the Federal Republic of Germany on Jul. 24, 2004, which is expressly incorporated herein in its entirety by reference thereto.

FIELD OF THE INVENTION

The present invention relates to a method and a device for forming noise-filtered output values from input values encumbered with noise. Such methods and such noise filters may be used, for example, in numerical control systems that permit manual setting of programmed feed rates and rotary speeds.

BACKGROUND INFORMATION

Modern numerical control systems for machine tools or robots may have a setting facility by which the user of such a control system is able to change the rate of motion, prespecified by a program along one or more axes, within certain limits. Thereby it is possible, for example, during the first testing of such a program, to select a clearly reduced feed speed for a tool, in order to be able to detect potential problems and still to be able to intervene at the right time. Such a setting facility, which is also referred to as an "override", may be implemented in the form of a potentiometer, which is mounted in an easily accessible manner on the control console of the control system or on a manual control element. In that manner, one is able to affect at any time the processing speed of the respective equipment.

The setting of the potentiometer is read off in analog fashion. As the signal, for example, the voltage at the sliding contact of the potentiometer may be used. This analog signal is then conducted to an A/D converter and digitized there and made available to the control system. However, since the connection between a potentiometer and an A/D converter may, under certain circumstances, be very long, and, in addition, this connection may travel in a very rough environment, such as a machine shop floor, the analog signal is frequently encumbered with noise. As such, the digitized override signal supplied to the control system may also be noise-infested. Thus, however, that the control system may generate a noise-infested speed specification that will be comprehended by the control loop. This may lead, for example to uncleanly cut surfaces in milling and machine cutting. Therefore, it is believed to be desirable to free the digitized override signal from noise to the greatest extent possible. The use of simple filters is not believed to be effective in these circumstances, since such filters may tend to result in transient reactions and delayed responses.

In Japanese Published Patent Application No. 5-68389, for the formation of noise-filtered output values from noise-encumbered input values, it is described to accumulate the deviation between output value and input value, and to take over the input value as the new output value, and, in this context, at the same time, to reset the accumulated deviation if the accumulated deviation exceeds a certain boundary value. However, this method may have the disadvantage that the accumulated deviation, even in the case of completely random noise, after a certain time will attain any boundary value without there being any genuine change in the input value (as, for example, in the setting of the potentiometer). This effect is comparable to the Brownian motion of a molecule that is executing purely random motions, and that will still, at some time, reach every point in a space in which it is enclosed. In the case of the override signal this means that, by using such a filter, high-frequency noise components may be clearly reduced, but low-frequency components may be maintained or even additionally generated, and may have a negative effect on the work result.

SUMMARY

According to an example embodiment of the present invention, a method may be provided by which noise-encumbered input values may be better able to be freed of noise.

An example embodiment of the present invention may provide a noise filter which may permit a better filtering of noise-encumbered input signals.

An example embodiment of the present invention may provide a method for forming noise-filtered output values from noise-encumbered input values, in which the input value is taken over as the new output value, and an accumulator is reset if an input value change condition is applicable. Furthermore, the accumulator is reset while maintaining the output value if at least one noise detection condition applies.

The foregoing may avoid the condition that, for example, one deviation accumulated in the accumulator between the input value and an output value, after a certain time, reaches a boundary value for the accumulated deviation, although only random noise was summed. In this manner, even low-frequency noise may be suppressed well. Using a suitable selection of input value change conditions and the noise detection condition, a filter may be provided that may attain the object very well, may respond rapidly and may make possible a sensitive setting of the override parameter.

According to an example embodiment of the present invention, a method for forming noise-filtered output values from noise-encumbered input values includes: resetting an accumulator and converting the input value into a new output value if an input value change condition occurs; and resetting the accumulator while maintaining the output value if at least one noise detection condition occurs.

The input value change condition may include an accumulated deviation between the output value and the input value exceeding a predetermined boundary value.

The method may include counting by a counter in the accumulator how often a deviation between the output value and the input value exceeds a first boundary value, and the input value change condition may include the counter exceeding a second boundary value.

The noise detection condition may include an absolute value of a deviation between the output value and the input value being less than a predetermined boundary value for the deviation.

The noise detection condition may include a product of a deviation between the output value and the input value and an accumulated deviation between the output value and the input value being negative.

The method may include resetting an accumulated deviation between the output value and the input value to one of (a) zero and (b) a current deviation.

According to an example embodiment of the present invention, a noise filter for forming noise-filtered output values from noise-encumbered input values includes: an input value change detection circuit connected to the input value; a latch circuit adapted to convert the input value as a new output value when triggered by the input value change detection circuit; and a noise detection device adapted to reset an accumulator in the input value change detection circuit.

The noise filter may include a differentiator connected to the input value and the output value. The differentiator may be adapted to form a deviation, and the output of the differentiator may be connected to the accumulator. The accumulator may be adapted to form an accumulated deviation and may include an output connected to a first comparator adapted to compare the accumulated deviation to a boundary value for the accumulated deviation. The first comparator may be connected to a reset input of the accumulator and a trigger input of the latch circuit.

The noise detection device may include a second comparator adapted to compare the output of the differentiator to a boundary value for the deviation, and the second comparator connected to the reset input.

The noise detection device may include a sign determination device adapted to determine a sign of a product of the deviation and the accumulated deviation, and the sign determination device may be connected to the reset input.

At least one of (a) the boundary value for the deviation and (b) the boundary value for the accumulated deviation may be settable.

According to an example embodiment of the present invention, a numerical control system includes an override setting device adapted to noise-filter override signals as noise-filtered output values from noise-encumbered input values. The override setting device includes: means for resetting an accumulator and converting the input value into a new output value if an input value change condition occurs; and means for resetting the accumulator while maintaining the output value if at least one noise detection condition occurs.

According to an example embodiment of the present invention, a numerical control system includes an override setting device adapted to noise-filter override signals as noise-filtered output values from noise-encumbered input values. The override setting device includes: an input value change detection circuit connected to the input value; a latch circuit adapted to convert the input value as a new output value when triggered by the input value change detection circuit; and a noise detection device adapted to reset an accumulator in the input value change detection circuit.

Further aspects and details of example embodiments of the present invention are described below with reference to the appended Figures.

DETAILED DESCRIPTION

Figure 1:
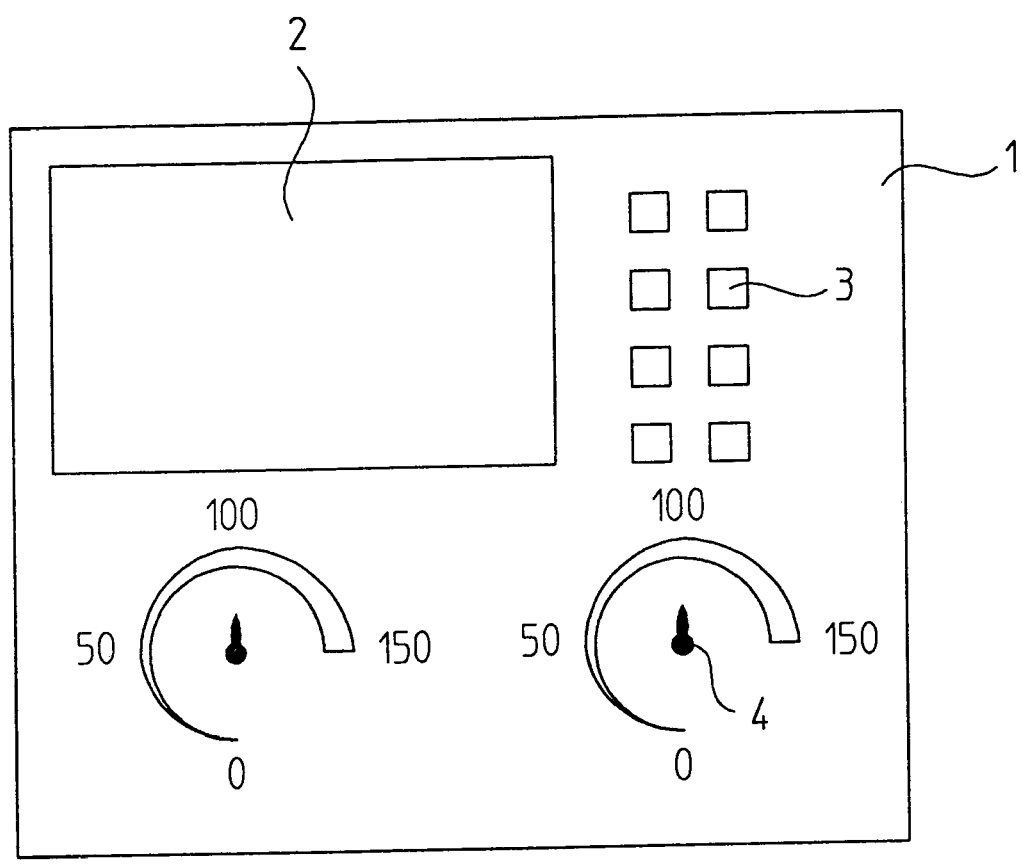
FIG. 1 illustrates a control console of a numerical control system.

FIG. 1 illustrates a control console 1 of a numerical control system. In addition to a screen 2 and input keys 3, two potentiometers 4 are illustrated. Using these potentiometers 4, the feed rate or the rotary speed of two numerically controlled axes may be changed with respect to a programmed feed rate or a programmed rotary speed within certain limits. For example, a setting of 0% to 150% of the programmed value may be possible. From a software technology point of view, one may also assign a plurality of axes to one potentiometer, so that, using one of the two potentiometers 4, the rotary speed of a tool spindle may be influenced, and using the other potentiometer 4, the feed rate of all positioning axes may be simultaneously influenced. From the two potentiometers 4, noise-encumbered signals are obtained which are present at the input to a sequential electronics and are evaluated there.

The analog signal of a potentiometer 4 is first digitized in an A/D converter. A sequence of noise-encumbered input values may be created therein. If these input values are used directly for influencing the programmed rotary and speed values, the noise may have a direct effect on the processing procedure, and thereby on the processing result, e.g., in the form of irregular surfaces. This effect may be particularly disadvantageous in the override setting for the rotary speed of the main spindle of lathes.

Figure 2:
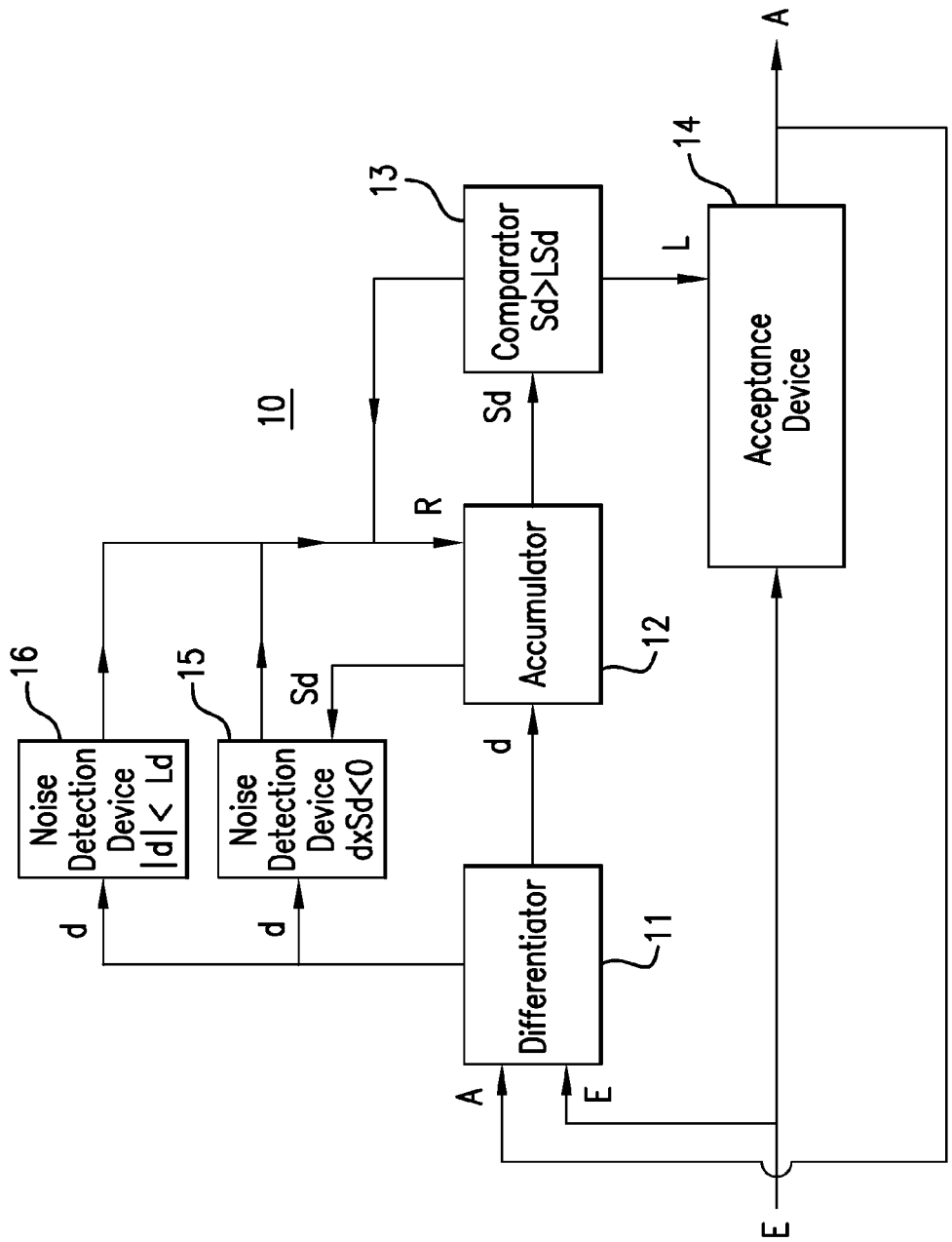
FIG. 2 illustrates a noise filter.

FIG. 2 illustrates a noise filter 10 for forming noise-filtered output values A from noise-encumbered input values E. Therefore, acceptance device 14 includes a memory whose content is output as output value A, and which in each case is overwritten with current input value E, when an appropriate signal is present at trigger input L. Such acceptance devices is also referred to as latch circuits.

The respectively current input values E and output values A are also supplied to a differentiator 11, which forms the difference d between output value A and input value E. To do this, differentiator 11 includes an arithmetic unit at whose output the difference or deviation d between its two inputs A, E is present.

Deviation d is supplied to an accumulator 12, which integrates or sums up the deviation with respect to time. This may be done very simply by adding on the respective deviation d at fixed time intervals to a memory in accumulator 12. As the time interval, the signal pulse of the A/D conversion of the analog signal of potentiometer 4 may be suitable. The content of the memory in accumulator is thus equal to the accumulated deviation Sd. Accumulator 12 has a reset input R, which resets accumulator 12 as a result of an appropriate signal. This may be done, for example, by setting the accumulated deviation to zero or to deviation d that is current at this particular time.

Accumulated deviation Sd is supplied to a first comparator 13. This first comparator 13 compares accumulated deviation Sd to a boundary value LSd. Only if accumulated deviation Sd is greater than boundary value LSd is a triggering signal emitted to triggering input L of latch circuit 14 and a reset signal is emitted to reset input R of accumulator 12. Thereby, current input value E is accepted as new output value A, and the accumulator is reset. The case Sd=LSd may have no special importance, and may trigger either an acceptance and a resetting or not. Differentiator 11, accumulator 12 and first comparator 13 together form an input value change detection circuit.

In order to prevent accumulator 12, only by accumulated noise, from reaching an accumulated deviation Sd that exceeds boundary value LSd, noise filter 10 also includes noise detection devices 15, 16. These are also connected to reset input R of accumulator 12, and thus may effect a resetting of accumulator 12 when it is recognized that changes at input E of noise filter 10 may be attributed only to noise. An acceptance of input value E as new output value A does not take place.

Second comparator 16 represents a first noise detecting device. It compares deviation d (received from differentiator 11) along with a boundary value Ld for the deviation. If the absolute value of deviation d is less than this boundary value Ld, noise is detected, and a corresponding signal is emitted to resetting input R of accumulator 12. If deviation d is above boundary value Ld, the resetting is omitted. How to handle the case of d=Ld may again be optional. Boundary value Ld may be selected to be very small, since it prevents a desired change of the override that is smaller than this boundary value. A value that is suitable for the respective requirements on the fineness of the possible setting of the override may need to be determined on a case-by-case basis, as well as the actual noise component in the input signal. The noise of input values E may, if possible, be within an interval [−Ld; Ld]. A typical boundary value Ld may, for example, amount to 0.5 per thousand of the value range of the A/D converter. This may correspond, for example, to the lowest valued bit of a 12-bit converter, whose value is in any case uncertain, in principle, and thus be subject to noise. A change only in this lowest value bit may thus be basically detected as noise, and the accumulator is reset.

Appropriately for boundary value Ld for the deviation in second comparator 16, the boundary value for accumulated deviation LSd may also be selected in first comparator 13. This boundary value LSd may be selected as approximately one to two orders of magnitude greater than boundary value Ld. In case of necessity, this boundary value LSd, just as Ld, may be adjusted by experiment to the respective situation. The values named may then be used as meaningful initial points for an optimization.

A second noise detection device 15 makes use of the fact that, in the case of different signs of deviation d and accumulated deviation Sd, it may be concluded that there is noise, since d and Sd then, so to speak, point in different directions, and thus there is a trend reversal at hand. Therefore, a sign ascertainer 15 receives both the deviation d from differentiator 11 and the accumulated deviation Sd from accumulator 12. The simplest manner to succeed in the sign comparison may be by multiplication of the two values and subsequent comparison to zero. If the product is less than zero, d and Sd have different signs. Then, sign ascertainer 15 emits a reset signal to accumulator 12. If the product is greater than zero, the reset signal is omitted. The case in which the product of d and Sd is equal to zero may again be treated optionally.

Figure 3:
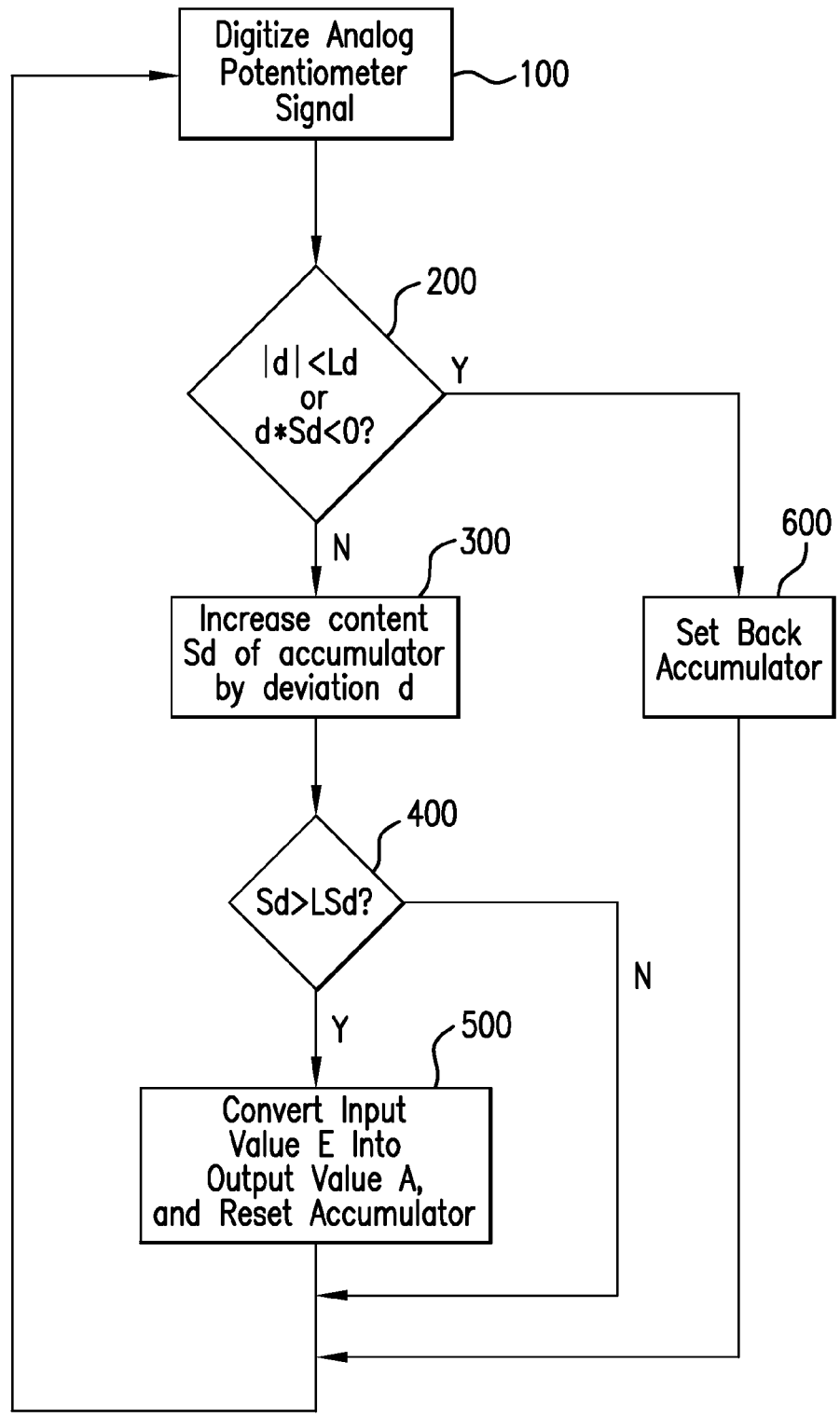
FIG. 3 illustrates a method for forming noise-filtered output values from input values encumbered with noise.

The device illustrated in FIG. 2 executes a sequence of method steps, which are explained in greater detail with reference to FIG. 3. Such a method may also be suitable for emulating in software technology. Thus, using already available hardware of a numerical control system, a device such as that illustrated in FIG. 2 may be emulated. Steps for the method are described below.

In a step 100, the present analog potentiometer signal is digitized using an A/D converter.

In a step 200, a test is made, with reference to a noise detection condition, as to whether only noise led to changes in input signal E. The conditions are:

$|d|<Ld$ or $d*Sd<0$, the satisfaction of one of the two conditions sufficing for the detection of noise. The method branches to step 600, which is described below.

If no noise is present, the method branches to a step 300. In this step, the content Sd of accumulator 12 is increased by the deviation d.

Then, in step 400, a check is made as to whether accumulated deviation Sd has exceeded boundary LSd. If this input value change condition is not satisfied, the method branches again to step 100, where a new execution of the method begins. However, if the input value change condition was satisfied, e.g., boundary LSd was exceeded, the method recognizes an actual change in input value E, and branches to a step 500. In this step, input value E is converted into output value A. With that, the change at input E is present also at output A. In addition, at step 500, accumulator 12 is reset.

After step 500, the method starts over again at step 100.

In step 600 which follows step 200, if noise is detected, accumulator 12 is set back. This may be done, for example, by setting the internal memory to zero, to d, or another value that is small compared to LSd. After step 600, the method may be begun again with step 100, but the method may also proceed with step 300. The first variant saves computing time, the second variant detects a great change (|d|>Ld) of input E, which goes along with different signs of d and Sd, still at the same clock pulse, and switches this change in step 500 to the output. After the first variant illustrated in FIG. 3, this occurs only one pulse (execution cycle of the method) later, which may normally be, however, negligible, and instead may use the resources of the numerical control more economically.

Certain variants for formulating the input value change condition are described below. In accumulator 12, a counting unit Z may be sufficient, which counts how often deviation d has an absolute value greater than a boundary value Ld. That is, the number of these events is accumulated. In first comparator 14, it is then checked whether a certain boundary number LZ of exceedings has already occurred, and possibly whether it causes the taking over of input value E as output value A and the resetting of counter Z in accumulator 12.

It is also possible to work with several different boundary values Ld1<Ld2<Ld3<Ld4 . . . for d and corresponding to several counters Z1, Z2, Z3, Z4 . . . in accumulator 12. For each boundary value Ldn there is then a counter Zn and a limit LZn for this counter Zn, for which LZ1>LZ2>LZ3>LZ4, etc, applies. If the absolute value of deviation d is, for example, between boundary values Ld2 and Ld3, first and second counters Z1, Z2 are incremented, the third and all additional counters Z3, Z4, . . . are reset. For at least one of the incremented counters Z1, Z2 (e.g., for all incremented counters), it is then checked whether the respective boundary value LZn of counter Zn has been exceeded, and in that case, input value E is taken over as the new output value A, and all the counters are reset. Thus, events, in which the absolute value of d is very large, may be weighted differently (even a few events (low LZn) are sufficient for detecting an input value change) than those having a smaller d (many events (large LZn) are required for detecting an input value change). In that manner, it may be possible to adapt the behavior of filter 10 very finely to the circumstances.

In summary, by resetting accumulator 12 while maintaining output value A in response to an appropriate noise detection condition (e.g., when it is recognized that a change in input value E relative to output value A is based only on noise), a response of the input value change condition, that is too rapid, may be avoided. In comparison to conventional methods and devices, boundary value LSd may be set clearly lower in first comparator 13, since an accumulation of random values over a longer period of time may be prevented by the reset procedures. Because of that, filter 10 may respond more rapidly and more sensitively to actual changes in input value E, and may eliminate noise from output value A, and thereby from the surfaces to be manufactured.

What is claimed is:

1. A method for forming noise-filtered output values from noise-encumbered input values, comprising:
   resetting an accumulator and converting the input value into a new output value if an input value change condition occurs; and
   resetting the accumulator while maintaining the output value if at least one noise detection condition occurs.

2. The method according to claim 1, wherein the input value change condition includes an accumulated deviation between the output value and the input value exceeding a predetermined boundary value.

3. The method according to claim 1, further comprising counting by a counter in the accumulator how often a deviation between the output value and the input value exceeds a first boundary value, the input value change condition including the counter exceeding a second boundary value.

4. The method according to claim 1, wherein the noise detection condition includes an absolute value of a deviation between the output value and the input value being less than a predetermined boundary value for the deviation.

5. The method according to claim 1, wherein the noise detection condition includes a product of a deviation between the output value and the input value and an accumulated deviation between the output value and the input value being negative.

6. The method according to claim 1, further comprising resetting an accumulated deviation between the output value and the input value to one of (a) zero and (b) a current deviation.

7. A noise filter for forming noise-filtered output values from noise-encumbered input values, comprising:
- an input value change detection circuit connected to the input value;
- a latch circuit adapted to convert the input value as a new output value when triggered by the input value change detection circuit; and
- a noise detection device adapted to reset an accumulator in the input value change detection circuit.

8. The noise filter according to claim 7, wherein the input value change detection circuit includes a differentiator connected to the input value and the output value, the differentiator adapted to form a deviation, an output of the differentiator connected to the accumulator, the accumulator adapted to form an accumulated deviation and including an output connected to a first comparator of the input value change detection circuit adapted to compare the accumulated deviation to a boundary value for the accumulated deviation, the first comparator connected to a reset input of the accumulator and a trigger input of the latch circuit.

9. The noise filter according to claim 8, wherein the noise detection device includes a second comparator adapted to compare the output of the differentiator to a boundary value for the deviation, the second comparator connected to the reset input.

10. The noise filter according to claim 9, wherein at least one of (a) the boundary value for the deviation and (b) the boundary value for the accumulated deviation are settable.

11. The noise filter according to claim 8, wherein the noise detection device includes a sign determination device adapted to determine a sign of a product of the deviation and the accumulated deviation, the sign determination device connected to the reset input.

12. A numerical control system, comprising:
- an override setting device adapted to noise-filter override signals as noise-filtered output values from noise-encumbered input values, including:
- means for resetting an accumulator and converting the input value into a new output value if an input value change condition occurs; and
- means for resetting the accumulator while maintaining the output value if at least one noise detection condition occurs.

13. A numerical control system, comprising:
- an override setting device adapted to noise-filter override signals as noise-filtered output values from noise-encumbered input values, including:
  - an input value change detection circuit connected to the input value;
  - a latch circuit adapted to convert the input value as a new output value when triggered by the input value change detection circuit; and
  - a noise detection device adapted to reset an accumulator in the input value change detection circuit.

* * * * *

UNITED STATES PATENT AND TRADEMARK OFFICE
CERTIFICATE OF CORRECTION

PATENT NO. : 7,603,399 B2  Page 1 of 1
APPLICATION NO. : 11/189676
DATED : October 13, 2009
INVENTOR(S) : Renger et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1114 days.

Signed and Sealed this

Fifth Day of October, 2010

David J. Kappos
*Director of the United States Patent and Trademark Office*